US011456205B2

(12) United States Patent
Evans et al.

(10) Patent No.: US 11,456,205 B2
(45) Date of Patent: Sep. 27, 2022

(54) METHODS FOR VARIABLE ETCH DEPTHS

(71) Applicant: Applied Materials, Inc., Santa Clara, CA (US)

(72) Inventors: Morgan Evans, Manchester, MA (US); Joseph C. Olson, Beverly, MA (US); Rutger Meyer Timmerman Thijssen, Sunnyvale, CA (US); Daniel Distaso, Merrimac, MA (US); Ryan Boas, Belmont, MA (US)

(73) Assignee: Applied Materials, Inc., Santa Clara, CA (US)

( * ) Notice: Subject to any disclaimer, the term of this patent is extended or adjusted under 35 U.S.C. 154(b) by 351 days.

(21) Appl. No.: 16/871,751

(22) Filed: May 11, 2020

(65) Prior Publication Data

US 2021/0351069 A1 Nov. 11, 2021

(51) Int. Cl.
*H01L 21/768* (2006.01)
*G03F 7/20* (2006.01)

(52) U.S. Cl.
CPC ...... *H01L 21/76802* (2013.01); *G03F 7/2051* (2013.01); *G03F 7/70691* (2013.01)

(58) Field of Classification Search
CPC ............. H01L 21/76802; G03F 7/2051; G03F 7/0005; G03F 7/70691; B29D 11/00769
See application file for complete search history.

(56) References Cited

U.S. PATENT DOCUMENTS

| 5,283,690 A | 2/1994 | Miyake et al. |
| 10,274,678 B1 | 4/2019 | Liu et al. |
| 2004/0013076 A1 | 1/2004 | Funato et al. |
| 2009/0263733 A1 | 10/2009 | Nomura |
| 2015/0311073 A1* | 10/2015 | Srinivasan ........ H01L 21/02546 438/504 |
| 2016/0033697 A1 | 2/2016 | Sainiemi et al. |
| 2016/0033784 A1* | 2/2016 | Levola ............... G02B 27/4205 385/37 |

(Continued)

FOREIGN PATENT DOCUMENTS

| CN | 103901516 A | 7/2014 |
| JP | 06-053600 A | 2/1994 |

(Continued)

OTHER PUBLICATIONS

International Search Report for PCT/US2019/059059 dated Feb. 21, 2020, 3 pages.

(Continued)

*Primary Examiner* — Kyoung Lee
*Assistant Examiner* — Christina A Sylvia
(74) *Attorney, Agent, or Firm* — KDB Firm PLLC

(57) ABSTRACT

Methods of producing grating materials with variable height fins are provided. In one example, a method may include providing a mask layer atop a substrate, the mask layer including a first opening over a first processing area and a second opening over a second processing area. The method may further include etching the substrate to recess the first and second processing areas, forming a grating material over the substrate, and etching the grating material in the first and second processing areas to form a plurality of structures oriented at a non-zero angle with respect to a vertical extending from a top surface of the substrate.

20 Claims, 10 Drawing Sheets

(56) References Cited

U.S. PATENT DOCUMENTS

| | | | |
|---|---|---|---|
| 2018/0095201 A1* | 4/2018 | Meili | G02B 6/124 |
| 2019/0129180 A1* | 5/2019 | Mohanty | G02B 6/122 |
| 2019/0137777 A1 | 5/2019 | Yang et al. | |
| 2019/0212480 A1 | 7/2019 | Evans et al. | |
| 2019/0258008 A1 | 8/2019 | Hautala et al. | |
| 2020/0018981 A1* | 1/2020 | Evans | G02B 27/0103 |
| 2020/0124865 A1 | 4/2020 | Meyer Timmerman Thijssen et al. | |
| 2020/0144109 A1 | 5/2020 | Meyer Timmerman Thijssen et al. | |
| 2020/0192009 A1 | 6/2020 | Evans et al. | |
| 2020/0363719 A1* | 11/2020 | Labonte | G03F 7/0035 |
| 2021/0257179 A1 | 8/2021 | Olson et al. | |
| 2022/0100078 A1 | 3/2022 | Zeeshan | |

FOREIGN PATENT DOCUMENTS

| | | |
|---|---|---|
| JP | 2000-193813 A | 7/2000 |
| JP | 2005-241943 A | 9/2005 |
| WO | 2020018270 A1 | 1/2020 |

OTHER PUBLICATIONS

Written Opinion for PCT/US2019/059059 dated Feb. 21, 2020, 5 pages.
Https://www.micro-resist.de/en/application/inkjet-printing; 4 pages.
International Search Report and Written Opinion dated Aug. 6, 2021, for the International Patent Application No. PCT/US2021/027613, filed on Apr. 16, 2021, 7 pages.

* cited by examiner

METHODS FOR VARIABLE ETCH DEPTHS

FIELD OF THE DISCLOSURE

The present disclosure generally relates to processing of grating materials. More specifically, the disclosure relates to methods of producing variable-depth grating materials.

BACKGROUND OF THE DISCLOSURE

Optical elements such as optical lenses have long been used to manipulate light for various advantages. Recently, micro-diffraction gratings have been utilized in holographic and augmented/virtual reality (AR and VR) devices. One particular AR and VR device is a wearable display system, such as a headset, arranged to display an image within a short distance from a human eye. Such wearable headsets are sometimes referred to as head mounted displays, and are provided with a frame displaying an image within a few centimeters of the user's eyes. The image can be a computer-generated image on a display, such as a micro display. The optical components are arranged to transport light of the desired image, where the light is generated on the display to the user's eye to make the image visible to the user. The display where the image is generated can form part of a light engine, so the image generates collimated light beams guided by the optical component to provide an image visible to the user.

The optical components may include structures with different slant angles, such as fins of one or more gratings, on a substrate, formed using an angled etch system. One example of an angled etch system is an ion beam chamber that houses an ion beam source. The ion beam source is configured to generate an ion beam, such as a ribbon beam, a spot beam, or full substrate-size beam. The ion beam chamber is configured to direct the ion beam at an angle relative to a surface normal of a substrate to generate a structure having a specific slant angle. Changing the slant angle of the structure to be generated by the ion beam requires substantial hardware reconfiguration of the of the ion beam chamber.

Forming optical devices that include different structures having different depths across the surface of the substrate has conventionally been performed using gray-tone lithography. However, gray-tone lithography is a time-consuming and complex process, which adds considerable costs to devices fabricated using the process.

Accordingly, improved methods and related equipment are needed for forming optical devices that include different structures with different slant angles and/or different depths across a single substrate.

SUMMARY

This Summary is provided to introduce a selection of concepts in a simplified form that are further described below in the Detailed Description. This Summary is not intended to identify key features or essential features of the claimed subject matter, nor is it intended as an aid in determining the scope of the claimed subject matter.

According to one embodiment, a method may include providing a mask layer atop a substrate, the mask layer including a first opening over a first processing area and a second opening over a second processing area. The method may further include etching the substrate to recess the first and second processing areas, forming a grating material over the substrate, and etching the grating material in the first and second processing areas to form a plurality of structures oriented at a non-zero angle with respect to a vertical extending from a top surface of the substrate.

According to another embodiment, a method of forming an optical device, may include providing a mask layer atop a substrate, the mask layer including a first opening defining a first processing area and a second opening defining a second processing area. The method may further include etching the substrate to recess the first and second processing areas, forming an optical grating material over the substrate, and forming a plurality of structures by etching a plurality of trenches into the optical grating material in the first and second processing areas, wherein the plurality of structures is oriented at a non-zero angle with respect to a vertical extending from a top surface of the substrate.

According to another embodiment, a method may include providing an ion beam source within a chamber, wherein the chamber is operable to deliver an ion beam to a substrate, and wherein the substrate includes a first processing area separated from a second processing area by a mask element. The method may further include etching the substrate to recess the first and second processing areas, wherein the first and second processing areas are recessed to different depths relative to a top surface of the substrate, forming an optical grating material over the substrate, and forming a plurality of structures by etching a plurality of trenches into the optical grating material in the first and second processing areas, wherein the plurality of structures is oriented at a non-zero angle with respect to a vertical extending from the top surface of the substrate.

BRIEF DESCRIPTION OF THE DRAWINGS

The accompanying drawings illustrate exemplary approaches of the disclosure, including the practical application of the principles thereof, as follows.

Figure 1:
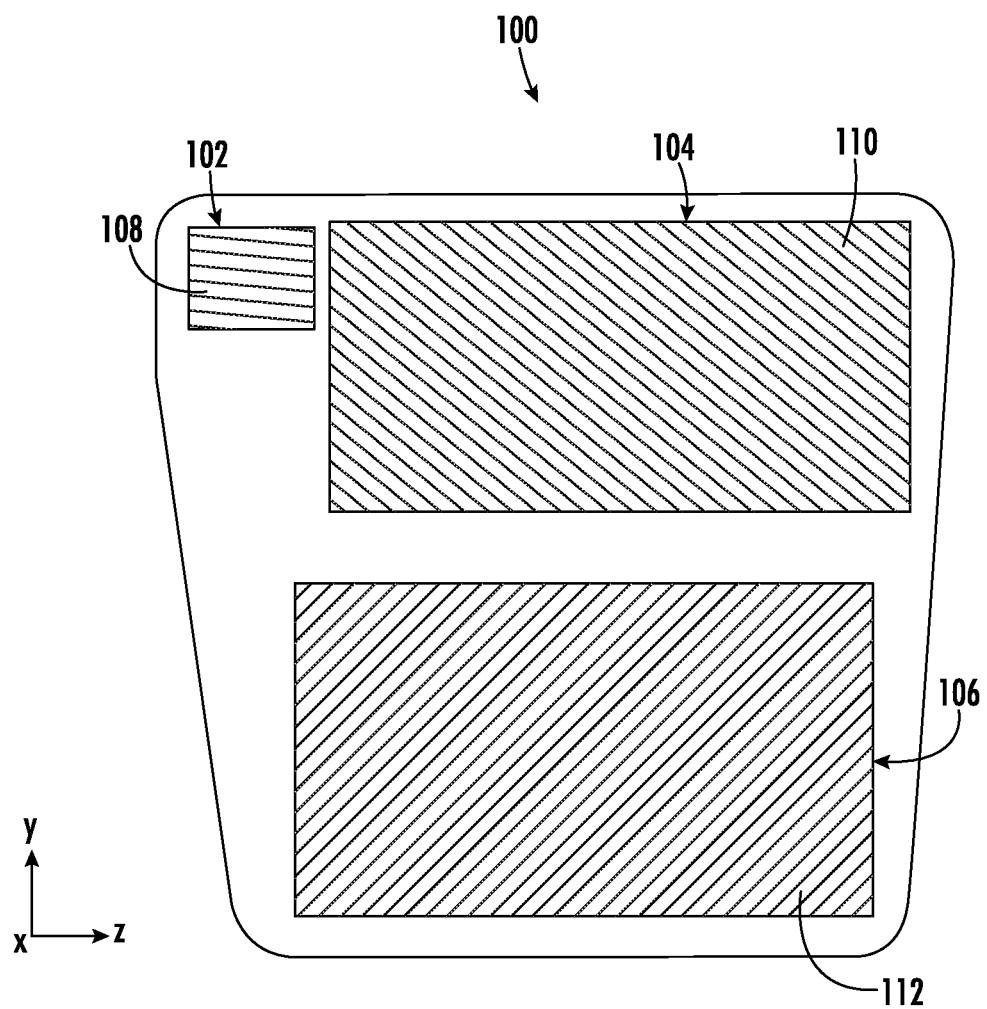
FIG. 1 is a perspective, frontal view of an optical device, according to embodiments of the present disclosure.

The drawings are not necessarily to scale. The drawings are merely representations, not intended to portray specific parameters of the disclosure. The drawings are intended to depict exemplary embodiments of the disclosure, and therefore are not be considered as limiting in scope. In the drawings, like numbering represents like elements.

Furthermore, certain elements in some of the figures may be omitted, or illustrated not-to-scale, for illustrative clarity. The cross-sectional views may be in the form of "slices", or "near-sighted" cross-sectional views, omitting certain background lines otherwise visible in a "true" cross-sectional view, for illustrative clarity. Furthermore, for clarity, some reference numbers may be omitted in certain drawings.

DETAILED DESCRIPTION

Apparatuses, systems, and methods in accordance with the present disclosure will now be described more fully hereinafter with reference to the accompanying drawings, where various embodiments are shown. The apparatuses, systems, methods may be embodied in many different forms and are not to be construed as being limited to the embodiments set forth herein. Instead, these embodiments are provided so the disclosure will be thorough and complete, and will fully convey the scope of the apparatuses, systems, and methods to those skilled in the art.

FIG. 1 is a perspective, frontal view of a device 100, such as an optical device, according to embodiments of the present disclosure. Examples of the optical device 100 include, but are not limited to, a flat optical device and a waveguide (e.g., a waveguide combiner). The optical device 100 includes one or more structures, such as gratings. In one embodiment, which can be combined with other embodiments described herein, the optical device 100 includes an input grating 102, an intermediate grating 104, and an output grating 106. Each of the gratings 102, 104, 106 includes corresponding structures 108, 110, 112 (e.g., fins). In one embodiment, which can be combined with other embodiments described herein, the structures 108, 110, 112 and depths between the structures include sub-micron critical dimensions (e.g., nano-sized critical dimensions), which may vary in one or more dimensions across the optical device 100.

Figure 2A:
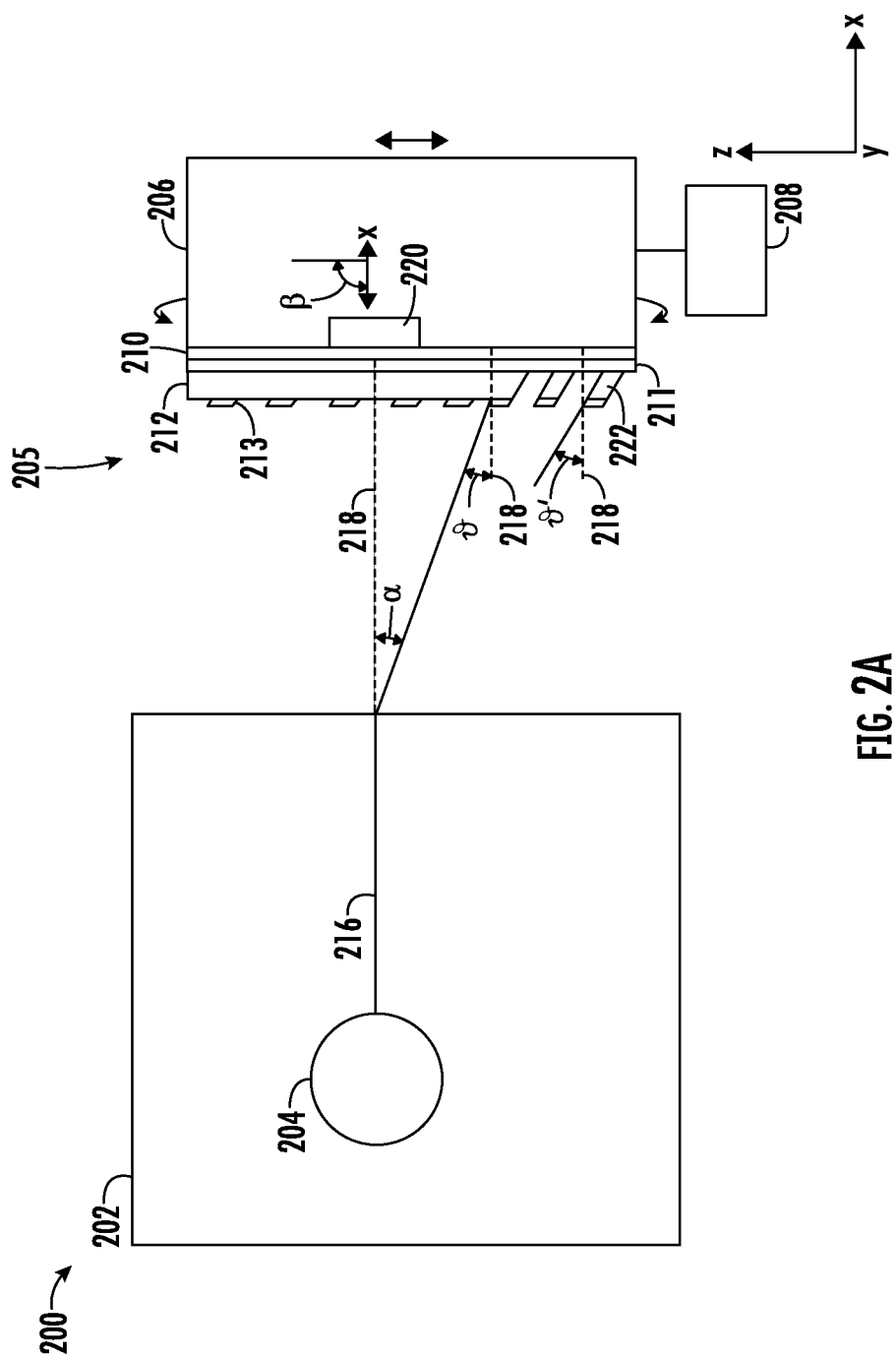
FIG. 2A is a side, schematic cross-sectional view of an angled etch system, according to embodiments of the present disclosure.
Figure 2B:
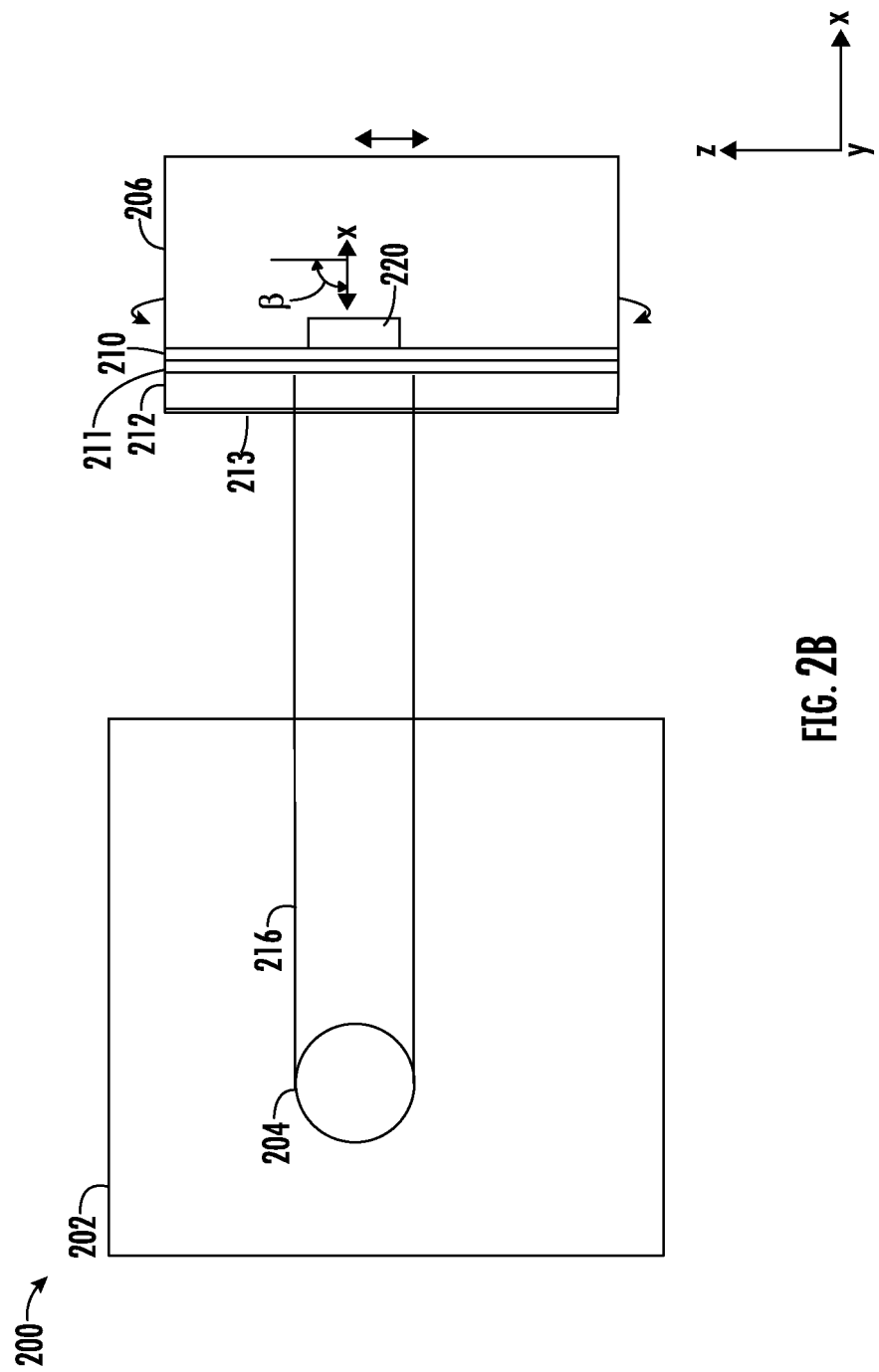
FIG. 2B is a top, schematic cross-sectional view of the angled etch system shown in FIG. 2A, according to embodiments of the present disclosure.

FIG. 2A is a side, schematic cross-sectional view and FIG. 2B is a top, schematic cross-sectional view of an angled etch system (hereinafter "system") 200, such as the Varian VIISta® system available from Applied Materials, Inc. located in Santa Clara, Calif. It is to be understood that the system 200 described below is an exemplary angled etch system and other angled etch systems, including angled etch systems from other manufacturers, may be used to or modified to form the structures described herein on a substrate.

FIGS. 2A-2B show a device 205 disposed on a platen 206. The device 205 may include a substrate 210, an etch stop layer 211 disposed over the substrate 210, an etching layer to be etched, such as a grating material 212 disposed over the etch stop layer 211, and a hardmask 213 disposed over the grating material 212. It will be appreciated that the device 205 may include different layering materials and/or combinations in other embodiments. For example, the etching layer may be a blanket film to be processed, such as a photoresist-type material or an optically transparent material (e.g., silicon or silicon nitride). The blanket film may be processed using a selective area processing (SAP) etch cycle(s) to form one or more sloped or curved surfaces of the device 205. In another embodiment, the etch stop layer 211 may not be present.

To form structures (e.g., fins) 222 having slant angles, the grating material 212 may be etched by the system 200. In one embodiment, the grating material 212 is disposed on the etch stop layer 211 disposed on the substrate 210. In one embodiment, the one or more materials of the grating material 212 are selected based on the slant angle of each structure to be formed and the refractive index of the substrate 210. In some embodiments, the grating material 212 includes one or more of silicon oxycarbide (SiOC), titanium dioxide ($TiO_2$), silicon dioxide (SiO2), vanadium (IV) oxide ($VO_x$), aluminum oxide ($Al_2O_3$), indium tin oxide (ITO), zinc oxide (ZnO), tantalum pentoxide ($Ta_2O_5$), silicon nitride ($Si_3N_4$), titanium nitride (TiN), and/or zirconium dioxide ($ZrO_2$) containing materials. The grating material 212 can have a refractive index between about 1.5 and about 2.65.

In some embodiments, the patterned hardmask 213 is a non-transparent hardmask that is removed after the device 205 is formed. For example, the non-transparent hardmask 213 can include reflective materials, such as chromium (Cr) or silver (Ag). In another embodiment, the patterned hardmask 213 is a transparent hardmask. In one embodiment, the etch stop layer 211 is a non-transparent etch stop layer that is removed after the device 205 is formed. In another embodiment, the etch stop layer 211 is a transparent etch stop layer.

The system 200 may include an ion beam chamber 202 that houses an ion beam source 204. The ion beam source 204 is configured to generate an ion beam 216, such as a ribbon beam, a spot beam, or full substrate-size beam. The ion beam chamber 202 is configured to direct the ion beam 216 at a first ion beam angle α relative to a surface normal 218 of the substrate 210. Changing the first ion beam angle α may require reconfiguration of the hardware of the ion beam chamber 202. The substrate 210 is retained on a platen 206 coupled to a first actuator 208. The first actuator 208 is configured to move the platen 206 in a scanning motion along a y-direction and/or a z-direction. In one embodiment, the first actuator 208 is further configured to tilt the platen 206, such that the substrate 210 is positioned at a tilt angle β relative to the x-axis of the ion beam chamber 202. In some embodiments, the first actuator 208 can further be configured to tilt the platen 206 relative to the y-axis and/or z-axis.

The first ion beam angle α and the tilt angle β result in a second ion beam angle ϑ relative to the surface normal 218 of the substrate 210 after the substrate 210 is tilted. To form structures having a slant angle ϑ' relative to the surface normal 218, the ion beam source 204 generates an ion beam 216 and the ion beam chamber 202 directs the ion beam 216 towards the substrate 210 at the first ion beam angle α. The first actuator 208 positions the platen 206, so that the ion beam 216 contacts the grating material 212 at the second ion beam angle ϑ and etches the grating material 212 to form the structures having a slant angle ϑ' on desired portions of the grating material 212.

Conventionally, to form a portion of structures with a slant angle ϑ' different than the slant angle ϑ' of an adjacent portion of structures, or to form structures having a different slant angle ϑ' on successive substrates, the first ion beam angle α is changed, the tilt angle β is changed, and/or multiple angled etch systems are used. Reconfiguring the hardware of the ion beam chamber 202 to change the first ion beam angle α is complex and time-consuming. Adjusting tilt angle β to modify the ion beam angle ϑ results in non-uniform depths of structures across portions of the substrate 210 as the ion beam 216 contacts the grating material 212 with different energy levels. For example, a portion positioned closer to the ion beam chamber 202 will have structures with a greater depth than structures of an adjacent potion positioned further away from the ion beam chamber 202. Using multiple angled etch systems increases the fabrication time and increases costs due the need of multiple chambers. To avoid reconfiguring the ion beam chamber 202, adjusting the tilt angle β to modify the ion beam angle ϑ, and using multiple angled etch systems, the angled etch system 200 may include a second actuator 220 coupled to the platen 206 to rotate the substrate 210 about the x-axis of the platen 206 to control the slant angle 'θ' of structures.

During use, the ion beam 216 may be extracted when a voltage difference is applied using a bias supply between the ion beam chamber 202 and substrate 210, or substrate platen, as in known systems. The bias supply may be coupled to the ion beam chamber 202, for example, where the ion beam chamber 202 and substrate 210 are held at the same potential.

The trajectories of ions within the ion beam 216 may be mutually parallel to one another or may lie within a narrow angular spread range, such as within 10 degrees of one another or less. In other embodiments, the trajectory of ions within the ion beam 216 may converge or diverge from one another, for example, in a fan shape. In various embodiments, the ion beam 216 may be provided as a ribbon reactive ion beam extracted as a continuous beam or as a pulsed ion beam, as in known systems.

In various embodiments, gas, such as reactive gas, may be supplied by a source to the ion beam chamber 202. The plasma may generate various etching species or depositing species, depending upon the exact composition of species provided to the ion beam chamber 202. The ion beam 216 may be composed of any convenient gas mixture, including inert gas, reactive gas, and may be provided in conjunction with other gaseous species in some embodiments. In some embodiments, the ion beam 216 and other reactive species may be provided as an etch recipe to the substrate 210 so as to perform a directed reactive ion etching (RIE) of a layer, such as the grating material 212. Such an etch recipe may use known reactive ion etch chemistries for etching materials such as oxide or other material, as known in the art. In other embodiments, the ion beam 216 may be formed of inert species where the ion beam 216 is provided to etch the substrate 210 or more particularly, the grating material 212, by physical sputtering, as the substrate 210 is scanned with respect to ion beam 216.

Figure 3A:
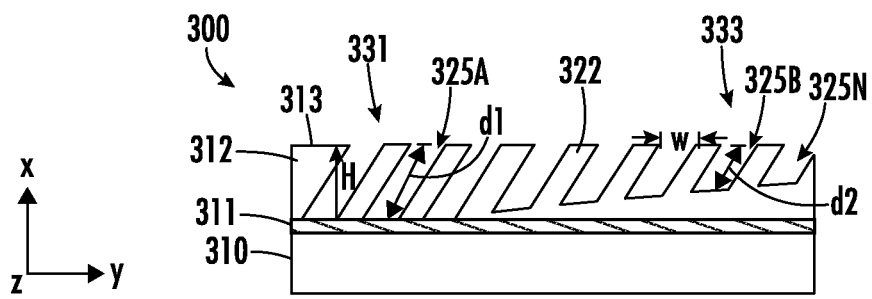
FIG. 3A depicts a side, cross sectional view of an optical grating component formed from a grating material, according to embodiments of the disclosure.
Figure 3B:
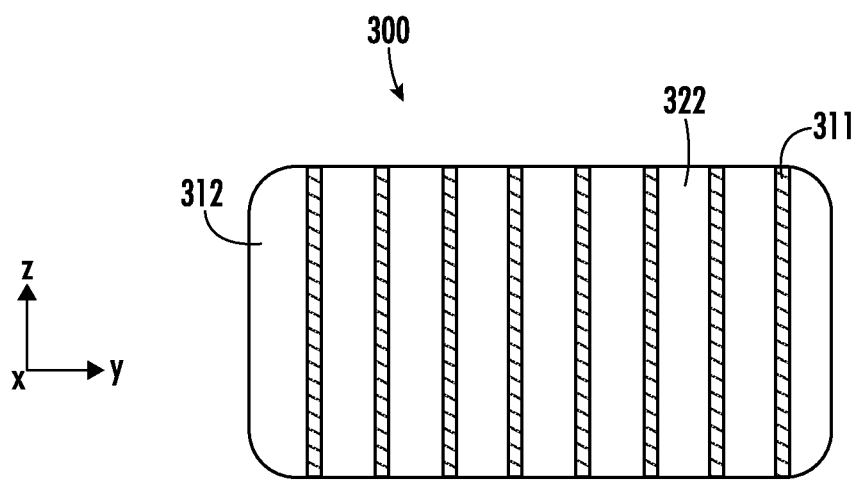
FIG. 3B depicts a frontal view of the optical grating component of FIG. 3A, according to embodiments of the present disclosure.

FIG. 3A depicts a side cross sectional view of an optical grating component 300 formed from the grating material 312 according to embodiments of the disclosure. FIG. 3B depicts a frontal view of the optical grating component 300. As shown, the optical grating component 300 includes a substrate 310, and the optical grating material 312 disposed on the substrate 310. The optical grating component 300 may be the same or similar to the input grating 102, the intermediate grating 104, and/or the output grating 106 of FIG. 1. In some embodiments, the substrate 310 is an optically transparent material, such as a known glass. In some embodiments, the substrate 310 is silicon. In the latter case, the substrate 310 is silicon, and another process is used to transfer grating patterns to a film on the surface of another optical substrate, such as glass or quartz. The embodiments are not limited in this context. In the non-limiting embodiment of FIG. 3A and FIG. 3B, the optical grating component 300 further includes an etch stop layer 311, disposed between the substrate 310 and the grating material 312. In other embodiments, no etch stop layer is present between the substrate 310 and the grating material 312.

In some embodiments, the optical grating optical grating component 300 may include a plurality of angled structures, shown as angled components or structures 322 separated by trenches 325A-325N. The structures 322 may be disposed at a non-zero angle of inclination (φ) with respect to a perpendicular to a plane (e.g., y-z plane) of the substrate 310 and the top surface 313 of the grating material 312. The angled structures 322 may be included within one or more fields of slanted gratings, the slanted grating together forming "micro-lenses."

In the example of FIG. 3A, the angled structures 322 and the trenches 325A-325N define a variable height along the direction parallel to the y-axis. For example, a depth 'd1' of a first trench 325A in a first portion 331 of the optical grating component 300 may be different than a depth 'd2' of a second trench 325B in a second portion 333 of the optical grating component 300. In some embodiments, a width of the angled structures 322 and/or the trenches 325 may also vary, e.g., along the y-direction.

The angled structures 322 may be accomplished by scanning the substrate 310 with respect to the ion beam using a processing recipe. In brief, the processing recipe may entail varying at least one process parameter of a set of process parameters, having the effect of changing, e.g., the etch rate or deposition rate caused by the ion beam during scanning of the substrate 310. Such process parameters may include the scan rate of the substrate 310, the ion energy of the ion beam, duty cycle of the ion beam when provided as a pulsed ion beam, the spread angle of the ion beam, and rotational position of the substrate 310. The etch profile may be further altered by varying the ion beam quality across the mask. Quality may include intensity/etch rate such as varying current with duty cycle or beam shape for different angles. In at least some embodiments herein, the processing recipe may further include the material(s) of the grating material 312, and the chemistry of the etching ions of the ion beam. In yet other embodiments, the processing recipe may include starting geometry of the grating material 312, including dimensions and aspect ratios. The embodiments are not limited in this context.

Figure 4:
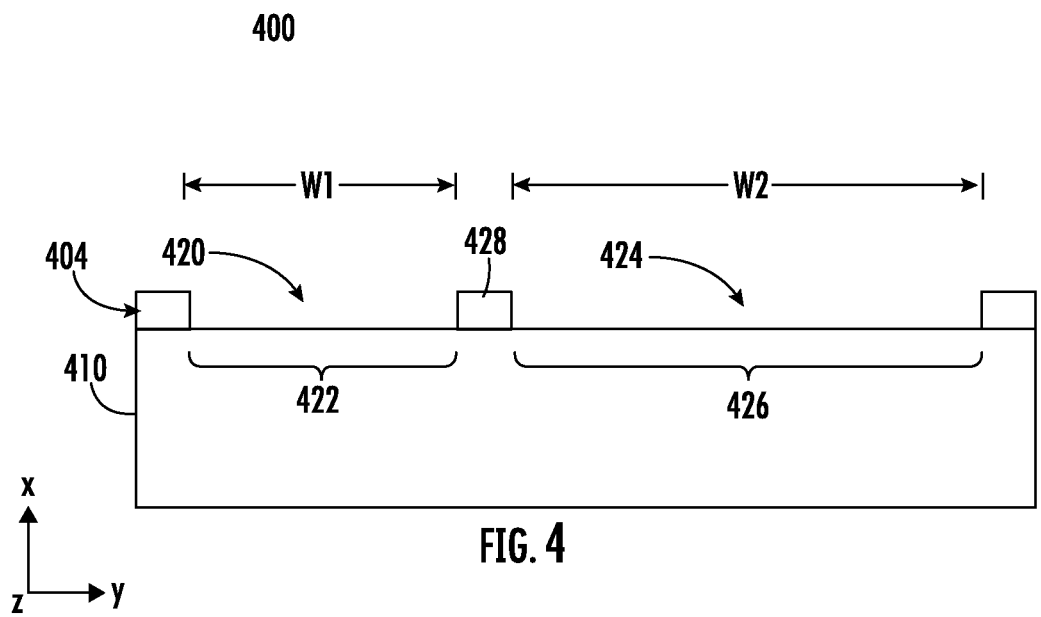
FIGS. 4-9 depict processes for forming a grating device, according to embodiments of the present disclosure.

Turning now to FIGS. 4-9, a process for forming an optical grating device 400 according to embodiments of the present disclosure will be described. As shown in FIG. 4, a mask layer 404 is provided atop a substrate 410. The mask layer 404 may be patterned or otherwise processed to include to a first opening 420 over a first processing area 422 and a second opening 424 over a second processing area 426. It will be appreciated that the first and second processing areas 422, 426 may correspond to areas of the substrate 410 where optical gratings or other semiconductor trenches/structures are to be formed. As shown, the first processing area 422 may be separated from the second processing area by a mask element 428 of the mask layer 404. The first opening 420 may have a first width 'W1' (e.g., along the y-direction) and the second opening 424 may have a second width 'W2', wherein W2>W1. Although not shown, the mask layer 404 may further include a third opening defining a third processing area.

Figure 5A:
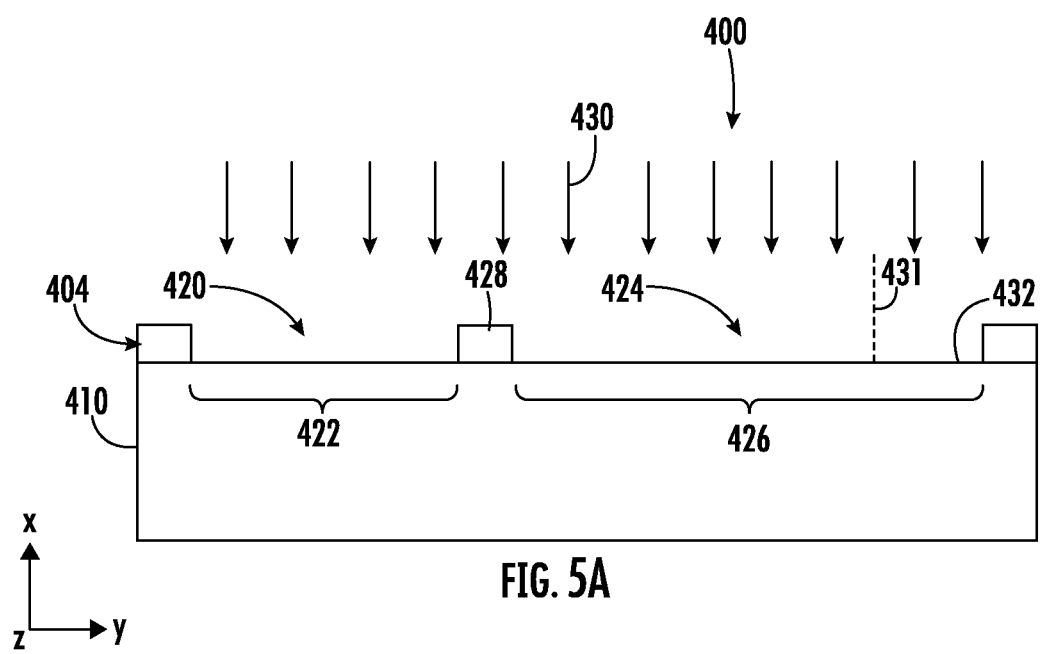

Next, as shown in FIG. 5A, the device 400 may be etched 430 for the purpose of recessing the substrate 410 in the first and second processing areas 422, 426. The etch 430 may be an ion etch performed/delivered at an angle parallel to a vertical 431 extending from a top surface 432 of the substrate 410. In other embodiments, the etch 430 may be performed at a non-zero angle relative to the vertical 431. Furthermore, it will be appreciated that the etch 430 may represent one or multiple etch cycles.

Figure 5B:
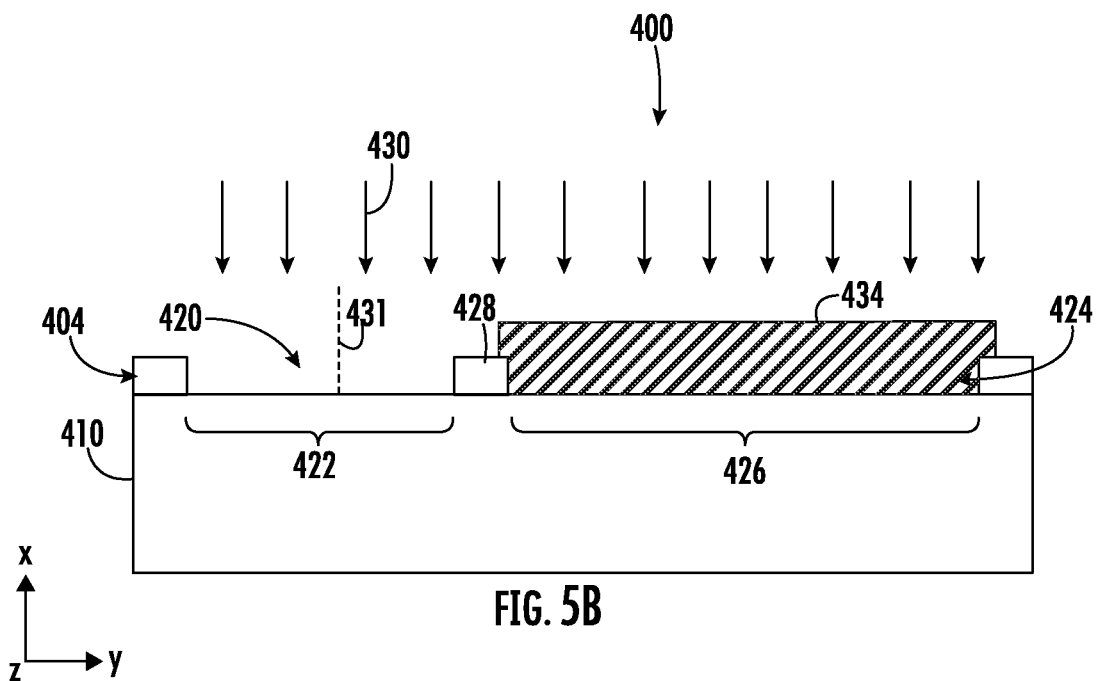

In some embodiments, as shown in FIG. 5B, a blocking element 434 may be formed over the second opening 424 to prevent the second processing area 426 from being impacted by one or more etch cycles of the etch 430. For example, the first processing area 422 may be etched for one or more etch cycles while the blocking element 434 is present over the second processing area 426. The blocking element 434 may then be removed, and both the first and second processing areas 422, 426 may be etched simultaneously. Although non-limiting, the blocking element 434 may be a gray tone (GT) resist film that etches away, thus allowing the etch 430 to impact the second processing area 426 after the first processing area 422. The blocking element 434 may be hardmask, such as a Cr hardmask, which is deposited as a thin film and lithographically patterned.

Figure 5C:
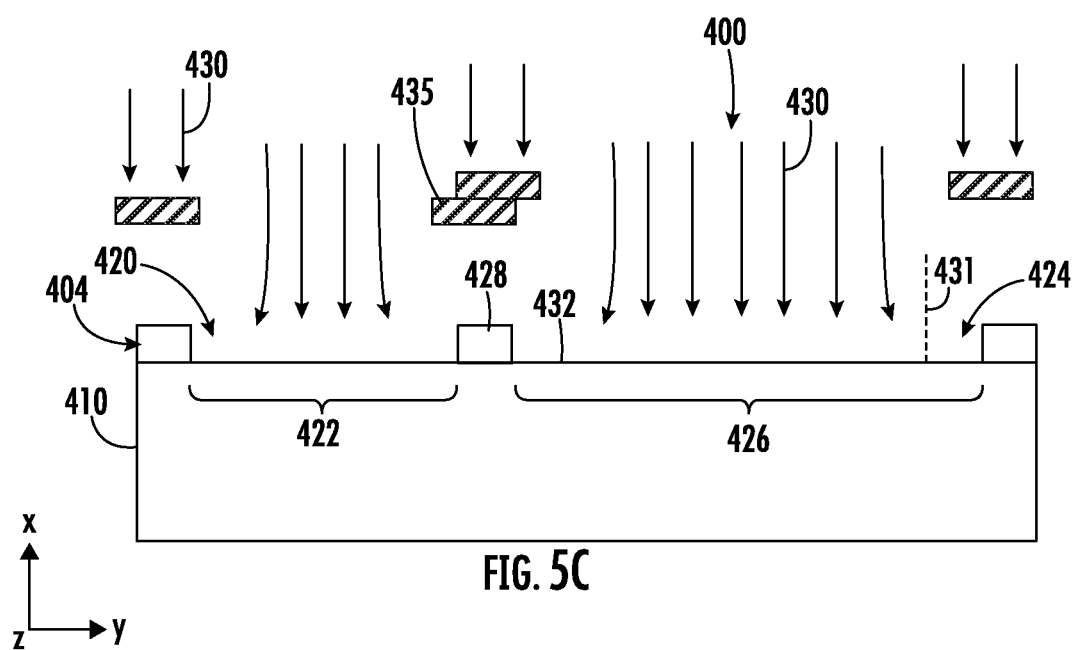
Figure 5D:
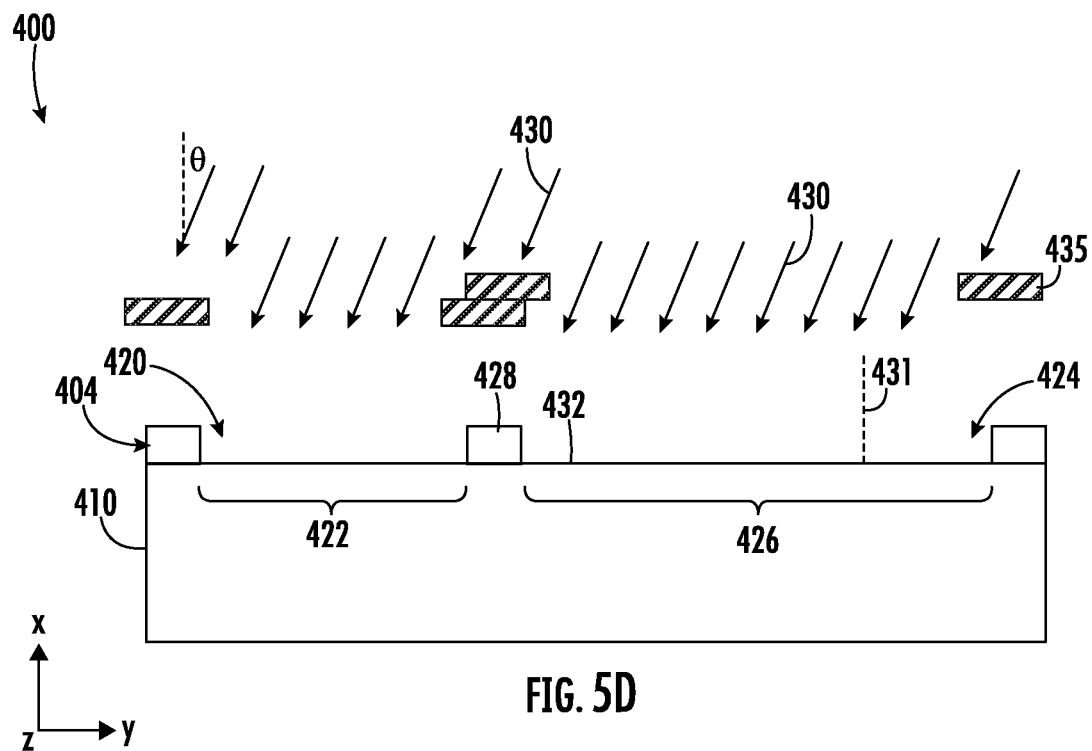

As shown in FIGS. 5C-5D, in another embodiment, the blocking element(s) may be a proximity or shadow mask 435, such as a metal or other material positioned above the substrate 410. The shadow mask 435 may include a plurality of openings formed therethrough, which permit passage of the ion beam of the etch 430 towards the substrate 410. The shadow mask 435 may be separated from the substrate by a gap or distance, e.g., along the x-direction. Stated another way, the shadow mask 435 is not typically formed directly atop the device substrate 410. However, in an alternative embodiment, the shadow mask 435 may be in direct physical contact with the device 400, while one or more edges defining at least one of the plurality of openings through the shadow mask 435 is spaced apart or raised above the substrate 410 to create a shadow effect In the embodiment of FIG. 5C, the etch 430 may be an ion etch performed/delivered at an angle parallel to the vertical 431 extending from the top surface 432 of the substrate 410. In the embodiment of FIG. 5D, the etch 430 may be performed at a non-zero angle θ relative to the vertical 431.

Each of the openings of the shadow mask 435 may be defined by a leading edge (e.g., relative to a direction of travel of the ions of the angled etch 430 of FIG. 5D) opposite a trailing edge. Each of the openings may be further defined by a first side edge opposite a second side edge (e.g., edges of the openings along the z-direction). It'll be appreciated that the openings may take on virtually any number, shape, or configuration. Furthermore, it'll be appreciated that one or more openings of the shadow mask 435 may take on a unique or different shape/configuration than the rest of the openings. Embodiments herein are not limited in this context.

In some non-limiting embodiments, the shadow mask 435 may further include a plurality of raised surface features along the leading, trailing, and/or side edges of the openings. The raised surface features may extend above a plane defined by a top surface of the shadow mask 435. In some embodiments, the shadow mask 435 may additionally or alternatively include surface features extending below a plane defined by a bottom surface of the shadow mask. It will be appreciated that the surface features may partially block the ion beam(s) of the etch 430, thus influencing an amount, angle, and/or depth the ion beam passing through respective openings and impacting the substrate 410.

Figure 6:
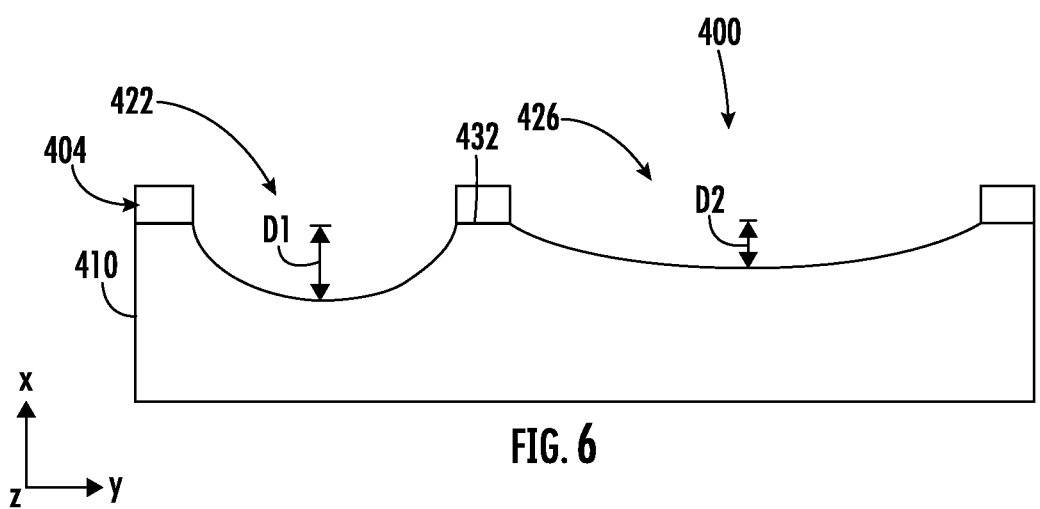

As shown in FIG. 6, the substrate 410 is recessed, relative to the top surface 432 of the substrate 410, in the first and second processing areas 422, 426 as a result of the etch 430. In some embodiments, the substrate 410 is recessed to a first depth 'D1' in the first processing area 422 and to a second depth 'D2' in the second processing area 426, wherein D1>D2. In other embodiments, the substrate 410 is recessed to a same, or substantially same, depth in both the first and second processing areas 422, 426. As shown, the top surface of the substrate 410 in the first and second processing areas 422, 426 may be sloped or curved.

Figure 7:
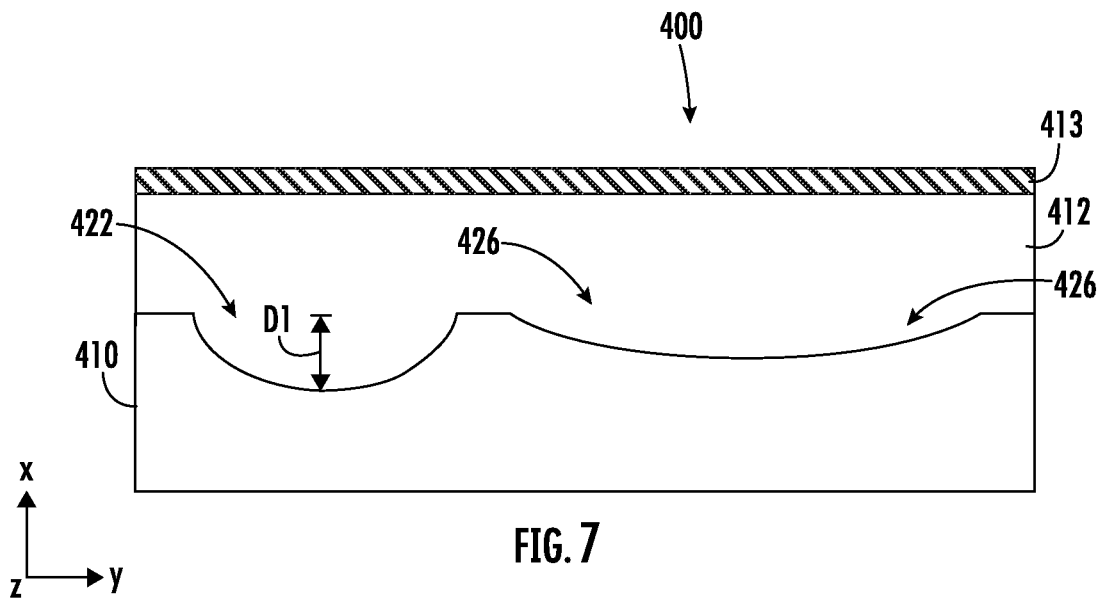

As shown in FIG. 7, a grating material 412 may then be formed over the device 400, for example, atop the substrate 410. The grating material 412 extends into the first and second processing areas 422, 426. A hardmask 413 may then be formed over the grating material 412. In some embodiments, the mask layer 404 (FIG. 6) may be removed prior to deposition of the grating material 412. In some embodiments, an etch stop layer (not shown) may be formed over the device 400 after the mask layer 404 is removed but before the grating material 412 is deposited. The grating material 412 may be an optical grating material made from one or more of silicon oxycarbide (SiOC), titanium dioxide (TiO$_2$), silicon dioxide (SiO2), vanadium (IV) oxide (VO$_x$), aluminum oxide (Al$_2$O$_3$), indium tin oxide (ITO), zinc oxide (ZnO), tantalum pentoxide (Ta$_2$O$_5$), silicon nitride (Si$_3$N$_4$), titanium nitride (TiN), and/or zirconium dioxide (ZrO$_2$) containing materials. The hardmask 413 may be a non-transparent hardmask, for example, including reflective materials, such as chromium (Cr) or silver (Ag). In another embodiment, the hardmask 413 is a transparent hardmask.

Figure 8:
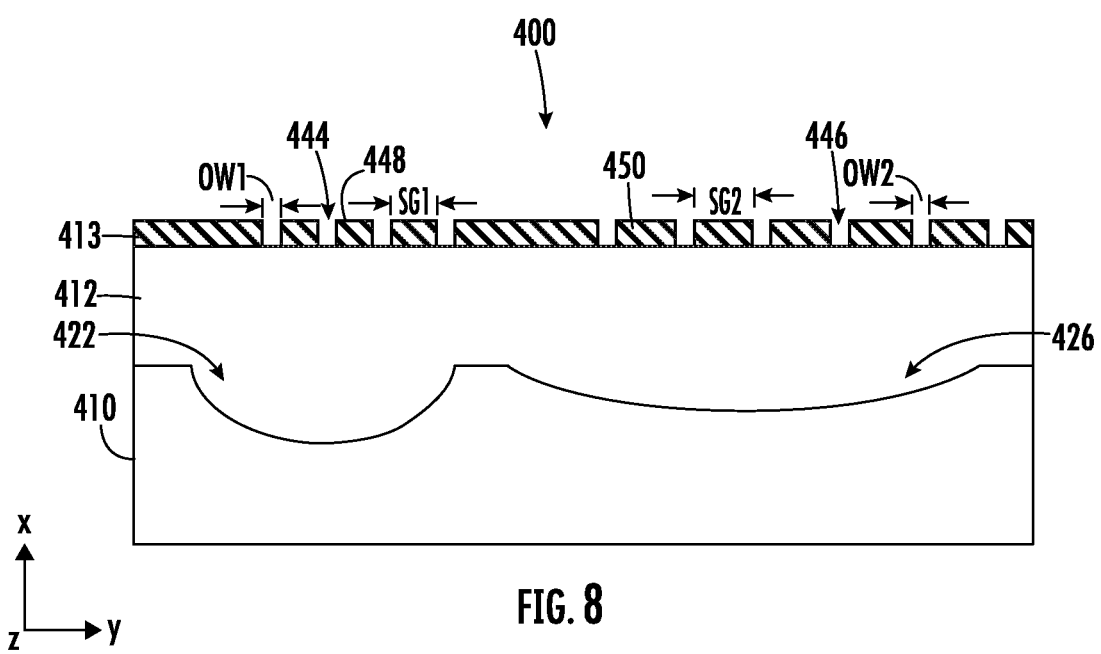

The hardmask 413 may then be patterned, as shown in FIG. 8. In some embodiments, a first set of openings 444 may be formed generally over the first processing area 422, while a second set of openings 446 may be formed generally over the second processing area 426. As shown, a first plurality of hardmask segments 448 are separated from one another by the first set of openings 444. Each of the first plurality of hardmask segments 448 may have a segment width 'SG1'. Similarly, a second plurality of hardmask segments 450 are separated from one another by the second set of openings 446, wherein the second plurality of hardmask segments 450 have a segment width 'SG2'. As shown, SG2>SG1. In other embodiments, SG1 and SG2 may be equal or approximately equal. Furthermore, each of the first set of openings 444 may have an opening width 'OW1' and each of the second set of openings 446 may have an opening width 'OW2'. In various embodiments, OW1 and OW2 may be the same or different.

Figure 9:
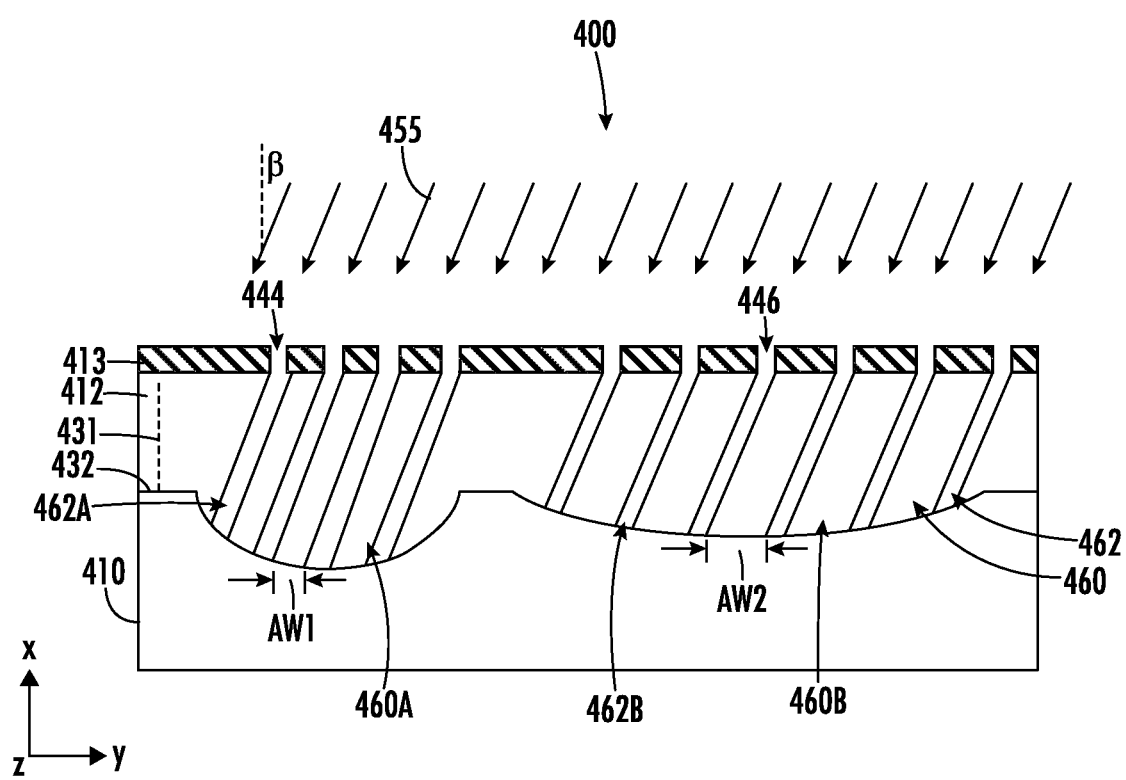

Next, as shown in FIG. 9, the device 400 may be etched 455 to form a plurality of structures 460 and a plurality of trenches 462. More specifically, the grating material 412 may be etched at a non-zero angle β relative to the perpendicular 431 extending from the top surface 432 of the substrate 410 to form a first set of angled structures 460A and a second set of angled structures 460B. The ions of the etch 455 may pass through the first set of openings 444 to form a first plurality of trenches 462A, and ions of the etch 455 may pass through the second set of openings 446 to form a second plurality of trenches 462B. In exemplary embodiments, each of the first and second plurality of trenches 462A-462B has a substantially flat bottom at the intersection of the substrate 410 and the grating material 412.

As shown, a depth between two or more trenches of the first plurality of trenches 462A may vary. Similarly, a depth between two or more trenches of the second plurality of trenches 462B may vary. In some embodiments, an average width 'AW1' of the first set of structures 460A may be different than an average width 'AW2' of the second set of structures 460B. In other embodiments, AW1 is equal to AW2. Furthermore, an angle of the first set of structures 460A may be the same or different than an angle of the second set of structures 460B. Once the first and second sets of structures 460A-460B are complete, the device 400 contains a plurality of diffracted optical elements. Although non-limiting, the first set of structures 460A may correspond to an input grating, while the second set of structures 460B may correspond to an intermediate grating or an output grating.

Figure 10:
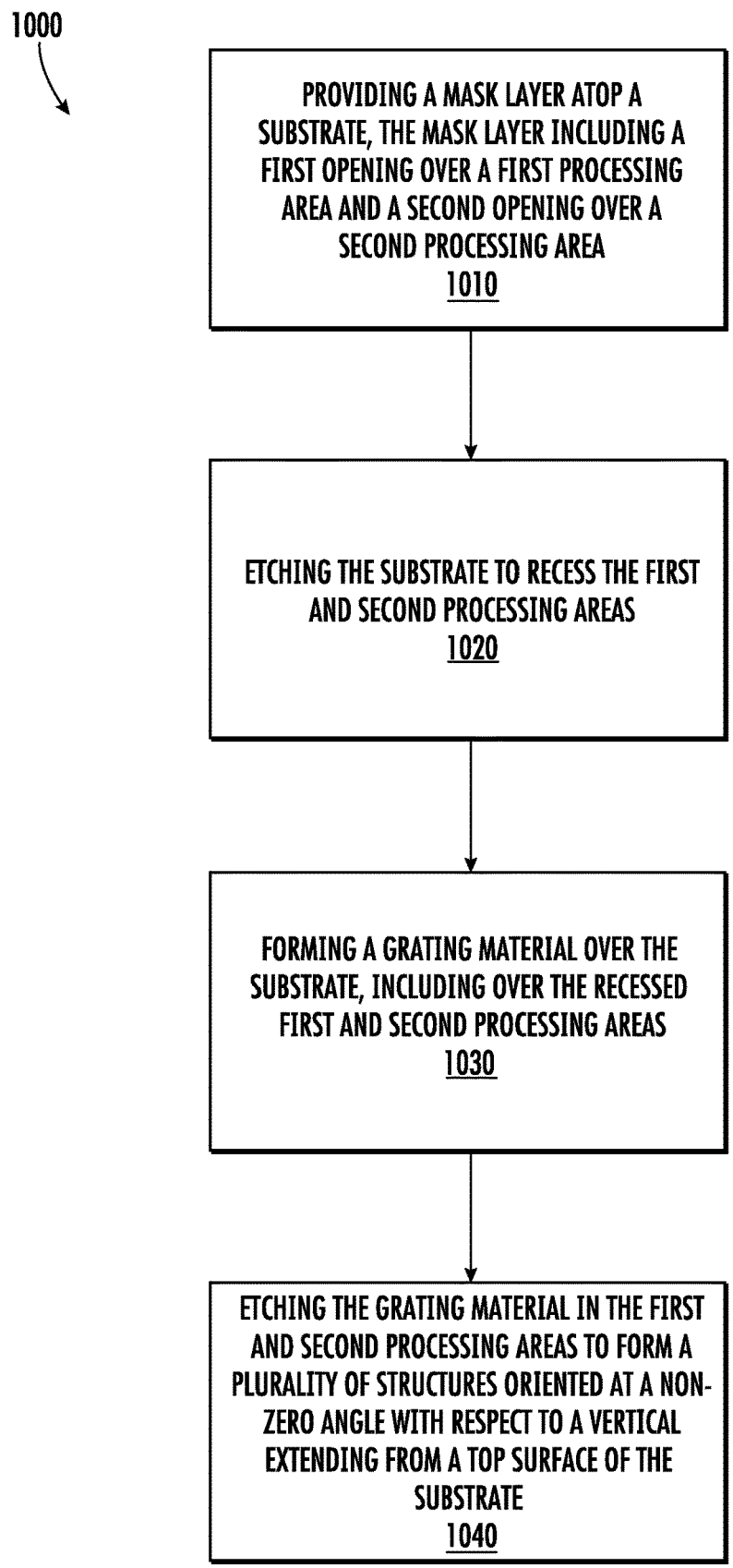
FIG. 10 is a flowchart of a method for forming a grating device, according to embodiments of the present disclosure.

Turning to FIG. 10, a method 1000 according to embodiments of the present disclosure will be described. As shown, at block 1010, the method 1000 may include providing a mask layer atop a substrate, the mask layer including a first opening over a first processing area and a second opening over a second processing area. In some embodiments, the mask layer further includes a third opening over a third processing area.

At block 1020, the method 1000 may include etching the substrate to recess the first and second processing areas. The etch may be an ion etch performed/delivered at an angle parallel to a vertical extending from a top surface of the substrate. In other embodiments, the etch may be performed at a non-zero angle relative to the vertical.

In some embodiments, a blocking element may be formed over the second opening to prevent the second processing area from being impacted by the etch. In one embodiment, the first processing area may be etched for one or more etch cycles while the blocking element is present over the second processing area. The blocking element may then be removed, and both the first and second processing areas may be etched simultaneously. In some embodiments, the first and second processing areas are recessed to different depths.

At block 1030, the method 1000 may further include forming a grating material over the substrate, including over the recessed first and second processing areas. In some embodiments, the grating material is an optical grating material formed atop the substrate after the mask layer has been removed.

At block 1040, the method 1000 may further include etching the grating material in the first and second processing areas to form a plurality of structures oriented at a non-zero angle with respect to a vertical extending from a top surface of the substrate. In some embodiments, the grating material is etched to form a first plurality of trenches and a second plurality of trenches. In some embodiments, the method includes varying an etch depth between two or more trenches of the first plurality of trenches, and varying an etch depth between two or more trenches of the second plurality of trenches. In some embodiments, the plurality of structures comprising a first set of structures and a second set of structures, wherein the first set of structures has a first average structure width, wherein the second set of structures has a second average structure width, and wherein the first average structure width is different than the second average structure width.

For the sake of convenience and clarity, terms such as "top," "bottom," "upper," "lower," "vertical," "horizontal," "lateral," and "longitudinal" will be used herein to describe the relative placement and orientation of components and their constituent parts as appearing in the figures. The terminology will include the words specifically mentioned, derivatives thereof, and words of similar import.

As used herein, an element or operation recited in the singular and proceeded with the word "a" or "an" is to be understood as including plural elements or operations, until such exclusion is explicitly recited. Furthermore, references to "one embodiment" of the present disclosure are not intended as limiting. Additional embodiments may also incorporate the recited features.

Furthermore, the terms "substantial" or "substantially," as well as the terms "approximate" or "approximately," can be used interchangeably in some embodiments, and can be described using any relative measures acceptable by one of ordinary skill in the art. For example, these terms can serve as a comparison to a reference parameter, to indicate a deviation capable of providing the intended function. Although non-limiting, the deviation from the reference parameter can be, for example, in an amount of less than 1%, less than 3%, less than 5%, less than 10%, less than 15%, less than 20%, and so on.

Still furthermore, one of ordinary skill will understand when an element such as a layer, region, or substrate is referred to as being formed on, deposited on, or disposed "on," "over" or "atop" another element, the element can be directly on the other element or intervening elements may also be present. In contrast, when an element is referred to as being "directly on," "directly over" or "directly atop" another element, no intervening elements are present.

In various embodiments, design tools can be provided and configured to create the datasets used to pattern the layers of the grating material and the diffracted optical elements described herein. For example, data sets can be created to generate photomasks used during lithography operations to pattern the layers for structures as described herein. Such design tools can include a collection of one or more modules and can also be comprised of hardware, software or a combination thereof. Thus, for example, a tool can be a collection of one or more software modules, hardware modules, software/hardware modules or any combination or permutation thereof. As another example, a tool can be a computing device or other appliance running software, or implemented in hardware.

As used herein, a module might be implemented utilizing any form of hardware, software, or a combination thereof. For example, one or more processors, controllers, ASICs, PLAs, logical components, software routines or other mechanisms might be implemented to make up a module. In implementation, the various modules described herein might be implemented as discrete modules or the functions and features described can be shared in part or in total among one or more modules. In other words, as would be apparent to one of ordinary skill in the art after reading the description, the various features and functionality described herein may be implemented in any given application. Furthermore, the various features and functionality can be implemented in one or more separate or shared modules in various combinations and permutations. Although various features or elements of functionality may be individually described or claimed as separate modules, one of ordinary skill in the art will understand these features and functionality can be shared among one or more common software and hardware elements.

By utilizing the embodiments described herein, a waveguide with regions of variable etch depth is formed. A first technical advantage of the waveguide of the present embodiments includes improved manufacturing efficiency by eliminating more time consuming and difficult processes. Further, a second technical advantage of the grating structures of the present embodiments includes providing a two dimensional or a three-dimensional shape, enabling use of the waveguide in an increased range of applications.

The present disclosure is not to be limited in scope by the specific embodiments described herein. Indeed, other various embodiments of and modifications to the present disclosure, in addition to those described herein, will be apparent to those of ordinary skill in the art from the foregoing description and accompanying drawings. Thus, such other embodiments and modifications are intended to fall within the scope of the present disclosure. Furthermore, the present disclosure has been described herein in the context of a particular implementation in a particular environment for a particular purpose. Those of ordinary skill in the art will recognize the usefulness is not limited thereto and the present disclosure may be beneficially implemented in any number of environments for any number of purposes. Thus, the claims set forth below are to be construed in view of the full breadth and spirit of the present disclosure as described herein.

What is claimed is:

1. A method, comprising:
providing a mask layer atop a substrate, the mask layer including a first opening over a first processing area and a second opening over a second processing area;
etching the substrate to recess the first and second processing areas;
forming a grating material over the substrate; and
etching the grating material in the first and second processing areas to form a plurality of structures oriented at a non-zero angle with respect to a vertical extending from a top surface of the substrate.

2. The method of claim 1, further comprising etching the grating material to form a first plurality of trenches and a second plurality of trenches.

3. The method of claim 2, further comprising varying an etch depth between two or more trenches of the first plurality of trenches, and varying an etch depth between two or more trenches of the second plurality of trenches.

4. The method of claim 1, further comprising recessing the first processing area to a first depth and recessing the second grating to a second depth, wherein the first depth is different than the second depth.

5. The method of claim 1, the plurality of structures comprising a first set of structures and a second set of structures.

6. The method of claim 5, wherein the first set of structures has a first average structure width, wherein the second set of structures has a second average structure width, and wherein the first average structure width is different than the second average structure width.

7. The method of claim 1, the mask layer further including a third opening over a third processing area.

8. The method of claim 1, wherein etching the substrate to recess the first and second processing areas comprises:
etching the first processing area while a blocking element is present over the second processing area;
removing the blocking element; and
etching the first and second processing areas.

9. The method of claim 1, further comprising:
forming a hardmask over the grating material; and
patterning a first set of openings over the first processing area and a second set of openings over the second processing area, wherein the grating material is etched through the first set of openings and the second set of openings.

10. The method of claim 1, wherein the grating material is an optical grating material.

11. A method of forming an optical device, comprising:
providing a mask layer atop a substrate, the mask layer including a first opening defining a first processing area and a second opening defining a second processing area;
etching the substrate to recess the first and second processing areas;
forming an optical grating material over the substrate; and
forming a plurality of structures by etching a plurality of trenches into the optical grating material in the first and second processing areas, wherein the plurality of structures is oriented at a non-zero angle with respect to a vertical extending from a top surface of the substrate.

12. The method of claim 11, wherein etching the plurality of trenches into the optical grating material comprises performing an angled ion implant to form a first plurality of trenches and a second plurality of trenches.

13. The method of claim 12, further comprising varying a trench depth between two or more trenches of the first plurality of trenches and varying a trench depth between two or more trenches of the second plurality of trenches.

14. The method of claim 11, further comprising recessing the first processing area to a first depth and recessing the second grating to a second depth, wherein the first depth is greater than the second depth.

15. The method of claim 11, the plurality of structures comprising a first set of structures and a second set of structures.

16. The method of claim 15, wherein the first set of structures has a first average structure width, wherein the second set of structures has a second average structure width, and wherein the first average structure width is different than the second average structure width.

17. The method of claim 11, the mask layer further including a third opening defining a third processing area.

18. The method of claim 11, wherein etching the substrate to recess the first and second processing areas, comprises:
forming a blocking element over the second processing area;
etching the first processing area while the blocking element is present over the second processing area;
removing the blocking element; and
etching the first and second processing areas.

19. The method of claim 11, further comprising:
forming a hardmask over the grating material; and
patterning a first set of openings over the first processing area and a second set of openings over the second processing area, wherein the grating material is etched through the first set of openings and the second set of openings.

20. A method, comprising:
providing an ion beam source within a chamber, wherein the chamber is operable to deliver an ion beam to a substrate, and wherein the substrate includes a first processing area separated from a second processing area by a mask element;
etching the substrate to recess the first and second processing areas, wherein the first and second processing areas are recessed to different depths relative to a top surface of the substrate;
forming an optical grating material over the substrate; and
forming a plurality of structures by etching a plurality of trenches into the optical grating material in the first and second processing areas, wherein the plurality of structures is oriented at a non-zero angle with respect to a vertical extending from the top surface of the substrate.

* * * * *